US011722083B2

(12) United States Patent
Chu

(10) Patent No.: US 11,722,083 B2
(45) Date of Patent: Aug. 8, 2023

(54) MOTOR CONTROLLER

(71) Applicant: Global Mixed-mode Technology Inc., Hsin-Chu (TW)

(72) Inventor: Chien-Lun Chu, Hsinchu County (TW)

(73) Assignee: Global Mixed-mode Technology Inc., Hsin-Chu (TW)

( * ) Notice: Subject to any disclaimer, the term of this patent is extended or adjusted under 35 U.S.C. 154(b) by 340 days.

(21) Appl. No.: 17/074,651

(22) Filed: Oct. 20, 2020

(65) Prior Publication Data
US 2022/0123679 A1 Apr. 21, 2022

(51) Int. Cl.
*H02P 21/22* (2016.01)
*H02P 27/08* (2006.01)
*H03K 7/08* (2006.01)

(52) U.S. Cl.
CPC .............. *H02P 21/22* (2016.02); *H02P 27/08* (2013.01); *H03K 7/08* (2013.01); *H02P 2205/01* (2013.01)

(58) Field of Classification Search
CPC .. H02P 27/08; H02P 21/22; H02P 7/29; H02P 6/085; H02P 6/28; H02P 2205/01; H03K 7/08
See application file for complete search history.

(56) References Cited

U.S. PATENT DOCUMENTS

| 6,016,042 | A * | 1/2000 | Miura | ................... | H02P 7/04 |
| | | | | | 318/434 |
| 7,915,843 | B2 * | 3/2011 | Mishima | ............... | H02P 6/26 |
| | | | | | 318/400.04 |
| 8,487,574 | B2 * | 7/2013 | Chiu | ..................... | H02P 7/29 |
| | | | | | 318/432 |
| 2004/0135529 | A1 * | 7/2004 | Yoshitomi | ............. | H02P 6/26 |
| | | | | | 318/400.04 |
| 2018/0159456 | A1 * | 6/2018 | Kato | ..................... | H02P 6/153 |
| 2020/0287492 | A1 | 9/2020 | Sega | | |

FOREIGN PATENT DOCUMENTS

| CN | 101313460 A | 11/2008 |
| CN | 102163945 A | 8/2011 |
| CN | 102223119 A | 10/2011 |
| CN | 103368482 A | 10/2013 |
| CN | 103604986 A | 2/2014 |
| CN | 107241038 A | 10/2017 |
| JP | 5-161391 A | 6/1993 |
| JP | 7-298677 A | 11/1995 |
| TW | 482362 | 4/2002 |
| TW | 201813278 A | 4/2018 |
| TW | 201902107 A | 1/2019 |

* cited by examiner

*Primary Examiner* — Thai T Dinh
(74) *Attorney, Agent, or Firm* — Winston Hsu

(57) ABSTRACT

A motor controller comprises a switch circuit, a pre-driver, a duty cycle control circuit, a current limit circuit, a pulse width modulation control unit, and a resistor. The motor controller is configured to drive a motor, where the motor has a motor coil and a maximum rated current. The switch circuit is configured to supply a motor current to the motor coil. The pre-driver generates a plurality of driving signals to control the switch circuit. The current limit circuit may store a current limit graph. The motor controller attains a function of maintaining a fixed output power by a plurality of current limit values, where each of the current limit values is less than or equal to the maximum rated current.

14 Claims, 4 Drawing Sheets

MOTOR CONTROLLER

BACKGROUND OF THE INVENTION

1. Field of the Invention

The present invention relates to a motor controller, and more particularly, to a motor controller which is capable of attaining a function of maintaining a fixed output power by a plurality of current limit values.

2. Description of the Prior Art

FIG. 1 is a circuit diagram showing a conventional motor controller 10. The motor controller 10 is used for driving a motor, where the motor has a motor coil L. The motor coil L has a first terminal O1 and a second terminal O2. The motor controller 10 comprises a switch circuit 100, a pre-driver 110, and a duty cycle control circuit 120. The switch circuit 100 is coupled to a terminal VCC and a terminal GND. The switch circuit includes a transistor 101, a transistor 102, a transistor 103, and a transistor 104 for supplying a motor current IL to the motor coil L. Each of the first transistor 101 and the third transistor 103 is a p-type MOSFET while each of the second transistor 102 and the fourth transistor 104 is an n-type MOSFET. The duty cycle control circuit 120 receives a command signal for generating a pulse width modulation signal Vp to the pre-driver 110, where the command signal Vc has an input duty cycle Di and the pulse width modulation signal Vp has an output duty cycle Do. FIG. 2 is a conventional output duty cycle graph. The duty cycle control circuit generates the output duty cycle Do based on the input duty cycle Di. When the output duty cycle Do approaches 1, the motor controller 10 may drive the motor at a full speed. The motor controller 10 may adjust the speed of the motor by the output duty cycle Do. Based on the pulse width modulation signal Vp, the pre-driver 110 generates a first driving signal D1, a second driving signal D2, a third driving signal D3, and a fourth driving signal D4, so as to respectively control the ON/OFF states of the transistor 101, the transistor 102, the transistor 103, and the transistor 104.

The motor controller 10 can be applied to a blower fan. When the path of the wind flow is blocked by foreign bodies, the wind pressure of the blower fan decreases, such that the speed of the motor increases while the motor current IL decreases. When desiring to get rid of foreign bodies by a larger wind flow, the value of the motor current IL cannot be obtained by the motor controller 10 and thus the maximum output power desired by the system cannot be achieved, even the closed loop control method regarding the speed is utilized.

SUMMARY OF THE INVENTION

According to one embodiment of the present invention, a motor controller which is capable of attaining a function of maintaining a fixed output power by a plurality of current limit values is provided. The motor controller is configured to drive a motor, where the motor has motor coil and a maximum rated current. The motor coil has a first terminal and a second terminal. The motor controller comprises a switch circuit, a pre-driver, a duty cycle control circuit, a current limit circuit, a pulse width modulation control unit, and a resistor. The switch circuit is coupled to a terminal VCC and a terminal S. The resistor is coupled to the terminal S and a terminal GND, where the terminal S may be coupled to a sensing pin. The switch circuit includes a first transistor, a second transistor, a third transistor, and a fourth transistor for supplying a motor current to the motor coil. The terminal S and the resistor can be used for sensing the motor current.

The pre-driver generates a plurality of driving signals to control the switch circuit. The current limit circuit receives a command signal for generating an output signal to the pulse width modulation control unit. The duty cycle control circuit is configured to generate a first pulse width modulation signal to the pulse width modulation control unit based on the command signal. The pulse width modulation control unit is configured to generate a second pulse width modulation signal to the pre-driver based on the first pulse width modulation signal and the output signal. The duty cycle control circuit may store an output duty cycle table or an output duty cycle graph. The current limit circuit may store a current limit table or a current limit graph. The motor controller may drive the motor according to the output duty cycle table and the current limit table. Also, the motor controller may drive the motor according to the output duty cycle graph and the current limit graph. The motor controller attains a function of maintaining a fixed output power by the current limit values, where each of the current limit values is less than or equal to the maximum rated current. The motor controller is operated in a closed loop control mode based on the current limit values.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION

Preferred embodiments according to the present invention will be described in detail with reference to the drawings.

Figure 1:
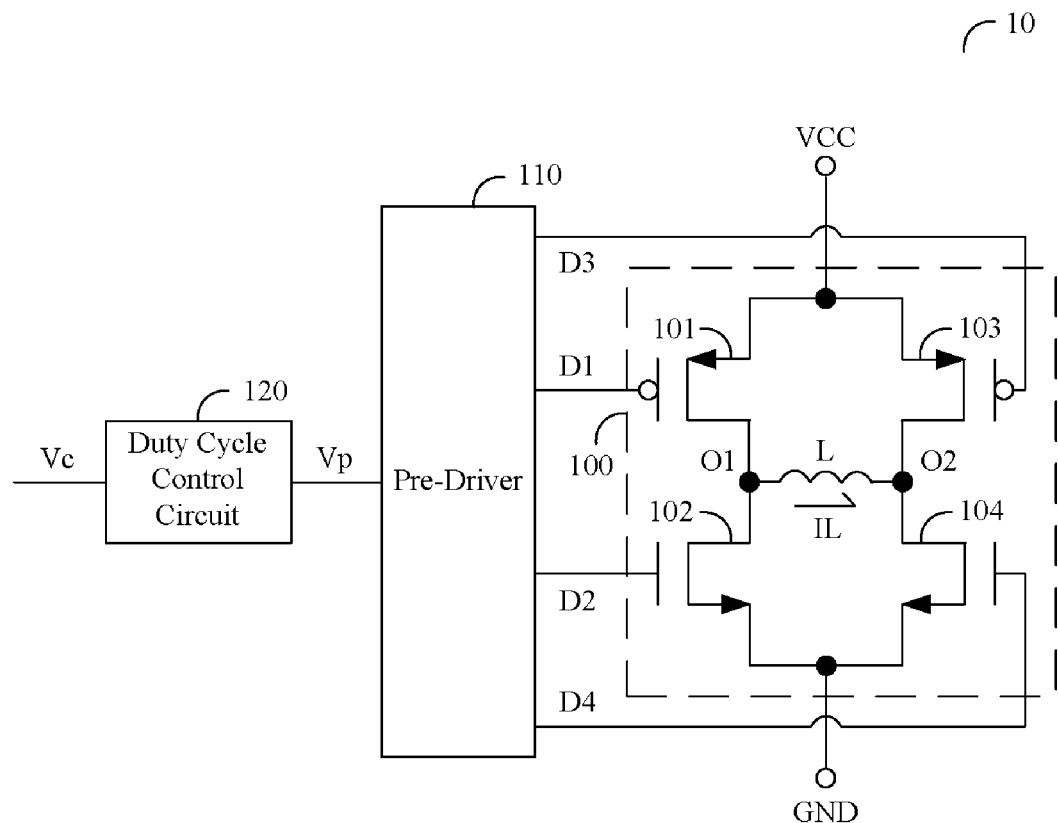
FIG. 1 is a circuit diagram showing a conventional motor controller.
Figure 2:
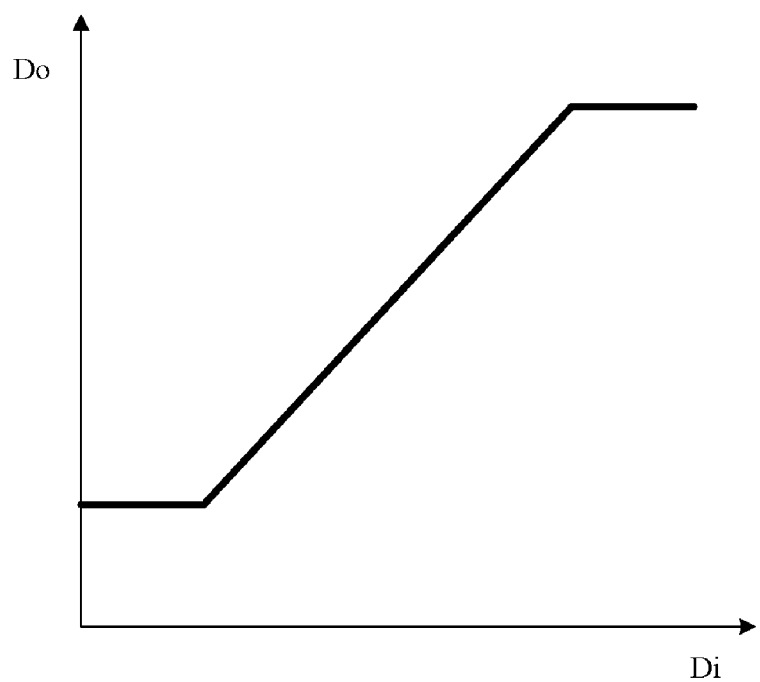
FIG. 2 is a conventional output duty cycle graph.
Figure 3:
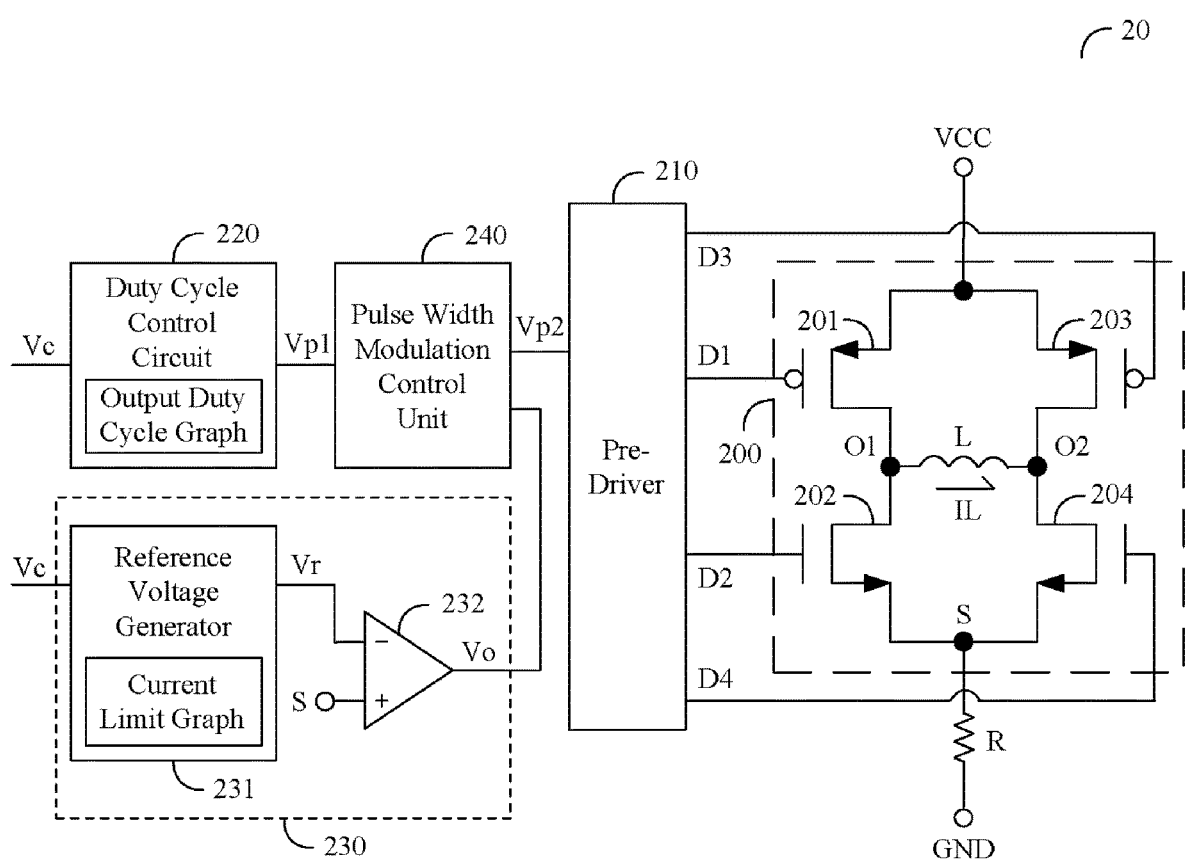
FIG. 3 is a circuit diagram showing a motor controller according to one embodiment of the present invention.

FIG. 3 is a circuit diagram showing a motor controller 20 according to one embodiment of the present invention. The motor controller 20 is used for driving a motor, where the motor has a motor coil L. Furthermore, the motor has a maximum rated current. If the current flowing through the motor coil L is greater than the maximum rated current for a long time, the motor may be damaged seriously. The motor coil L has a first terminal O1 and a second terminal O2. The motor controller 20 comprises a switch circuit 200, a pre-driver 210, a duty cycle control circuit 220, a current limit circuit 230, a pulse width modulation control unit 240, and a resistor R. The switch circuit 200 is coupled to a terminal VCC and a terminal S. The resistor R is coupled to the terminal S and a terminal GND, where the terminal S may be coupled to a sensing pin. The switch circuit 200 includes a first transistor 201, a second transistor 202, a third transistor 203, and a fourth transistor 204 for supplying a motor current IL to the motor coil L. The terminal S and the resistor R can be used for sensing the motor current IL. The first transistor 201 is coupled to the terminal VCC and the first terminal O1 while the second transistor 202 is coupled to the first terminal O1 and the terminal S. The third transistor 203 is coupled to the terminal VCC and the second terminal O2 while the fourth transistor 204 is coupled to the second terminal O2 and the terminal S. Each of the first transistor 201 and the third transistor 203 may be a p-type MOSFET while each of the second transistor 202 and the fourth transistor 204 may be an n-type MOSFET. The pre-driver 210 generates a first driving signal D1, a second driving signal D2, a third driving signal D3, and a fourth driving signal D4 for respectively controlling the ON/OFF states of the first transistor 201, the second transistor 202, the third transistor 203, and the fourth transistor 204.

The pre-driver 210 operates alternatively in a first driving mode and a second driving mode, so as to supply the electric energy to the motor. In the first driving mode, the pre-driver 210 turns on the first transistor 201 and the fourth transistor 204 by controlling the first driving signal D1 and the fourth driving signal D4. At this moment the current flows sequentially from the terminal VCC to the first transistor 201, the motor coil L, the fourth transistor 204, and the terminal GND for supplying the electric energy to the motor. In the second driving mode, the pre-driver 210 turns on the second transistor 202 and the third transistor 203 by controlling the second driving signal D2 and the third driving signal D3. At this moment the current flows sequentially from the terminal VCC to the third transistor 203, the motor coil L, the second transistor 202, and the terminal GND for supplying the electric energy to the motor. By operating alternatively between the first driving mode and the second driving mode, the motor can be rotated normally as a result.

The duty cycle control circuit 220 receives a command signal Vc for generating a first pulse width modulation signal Vp1 to the pulse width modulation control unit 240, where the command signal Vc has an input duty cycle Di while the first pulse width modulation signal Vp1 has an output duty cycle Do. The command signal may be used for adjusting the speed of the motor. The current limit circuit 230 comprises a reference voltage generator 231 and a comparator 232. The current limit circuit 230 receives the command signal Vc for generating an output signal Vo to the pulse width modulation control unit 240. Based on the first pulse width modulation signal Vp1 and the output signal Vo, the pulse width modulation control unit 240 generates a second pulse width modulation signal Vp2 to the pre-driver 210, where the second pulse width modulation signal Vp2 has a final duty cycle Df. The pre-driver 210 respectively controls the ON/OFF states of the first transistor 201, the second transistor 202, the third transistor 203, and the fourth transistor 204 based on the final duty cycle Df. The duty cycle control circuit 220 may store an output duty cycle graph, where the output duty cycle graph defines the relationship between the output duty cycle Do and the input duty cycle Di. The current limit circuit 230 may store a current limit graph, where the current limit graph defines the relationship between the current limit CL of the motor current IL and the input duty cycle Di. The system may use the output duty cycle graph and the current limit graph for driving the motor. Also, the system may solely use the current limit graph for driving the motor.

Figure 4:
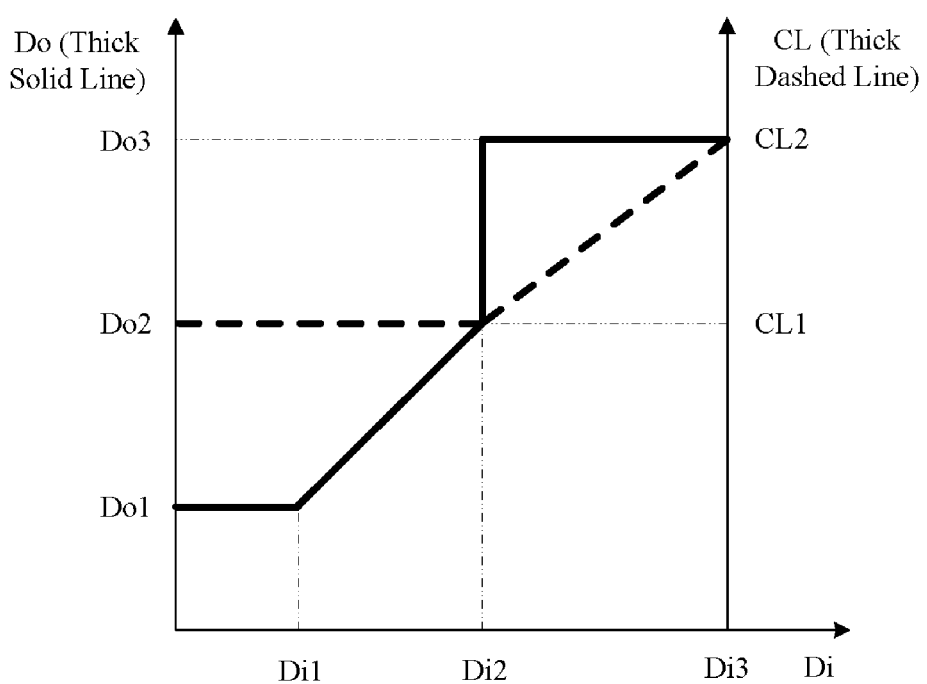
FIG. 4 shows an output duty cycle graph and a current limit graph according to one embodiment of the present invention.

According to one embodiment of the present invention, the motor controller 20 can be applied to a blower fan. FIG. 4 shows the output duty cycle graph and the current limit graph according to one embodiment of the present invention. Please refer to FIG. 3 and FIG. 4 simultaneously. More specifically, when the input duty cycle Di is less than or equal to a first input duty cycle value Di1, the output duty cycle Do is set to be equal to a first output duty cycle value Do1. When the input duty cycle Di is greater than the first input duty cycle value Di1 and the input duty cycle Di is less than or equal to a second input duty cycle value Di2, the output duty cycle Do increases linearly with the input duty cycle Di, where the second input duty cycle value Di2 corresponds to a second output duty cycle value Do2. When the path of the wind flow is blocked by foreign bodies, the wind pressure of the blower fan decreases, such that the speed of the motor increases while the motor current IL decreases. When desiring to get rid of foreign bodies by a larger wind flow, the output duty cycle Do can be set to be equal to a third output duty cycle value Do3, where the third output duty cycle value Do3 may be 1 or a value near 1.

Based on the current limit graph, the system may obtain a first current limit value CL1, a second current limit value CL2, or a value between the first current limit value CL1 and the second current limit value CL2 by adjusting the input duty cycle Di, where the first current limit value CL1 corresponds to the second input duty value Di2 while the second current limit value CL2 corresponds to a third input duty cycle value Di3. According to one embodiment of the present invention, the current limit CL may have 64 current limit values. Each of 64 current limit values is less than or equal to the maximum rated current to prevent the motor from damage. That is to say, there are 62 current limit values (CL01-CL62) between the first current limit CL1 and the second current limit CL2. The reference voltage generator 231 receives the command signal Vc for generating a reference voltage Vr to the comparator 232. The reference voltage generator 231 may store the current limit graph. Based on the current limit graph and the input duty cycle Di, the reference voltage generator 231 enables the reference voltage Vr to have 64 voltage levels (VL01-VL64), where 64 voltage levels (VL01-VL64) respectively corresponds to 64 current limit values (CL1, CL01-CL62, and CL2). The terminal S and the resistor R can be used for sensing the motor current IL. The comparator 232 is configured to generate the output signal Vo to the pulse width modulation control unit 240 by comparing the voltage of the terminal S with the reference voltage Vr. When the output signal Vo is at a low level L, the pulse width modulation control unit 240 keeps increasing the final duty cycle Df. When the output signal Vo is at a high level H, it indicates that the current limit happens and the pulse width modulation control unit 240 decreases the final duty cycle Df Such control method results that the current limit keeps happening and a closed loop control mode forms. When the voltage of the terminal VCC is a fixed value, the system is capable of controlling a target current limit value by the input duty cycle Di and the current limit graph, so as to attain a function of maintain a fixed output power. Moreover, the system may adjust the second input duty cycle value Di2, the third input duty cycle value Di3, the second output duty cycle value Do2, and the third output duty cycle value Do3 by different applications.

According to another embodiment of the present invention, the duty cycle control circuit 220 may store an output duty cycle table for replacing the output duty cycle graph, where the output duty cycle table defines the relationship between a plurality of output duty cycle values and a plurality of input duty cycle values. The current limit circuit 230 may store a current limit table for replacing the current limit graph, where the current limit table defines the relationship between a plurality of current limit values and a plurality of input duty cycle values. The system may use the output duty cycle table and the current limit table for driving the motor. Also, the system may solely use the current limit table for driving the motor. The function of the output duty cycle table may be similar to the function of the output duty cycle graph. The function of the current limit table may be similar to the function of the current limit graph.

According to one embodiment of the present invention, the motor controller 20 can be applied to a blower fan. The motor controller 20 is configured to drive a motor, where the motor has the motor coil L and the maximum rated current. The motor controller 20 comprises the switch circuit 200, the pre-driver 210, the duty cycle control circuit 220, the current limit circuit 230, the pulse width modulation control unit 240, and the resistor R. The switch circuit 200 is configured to supply the motor current IL to the motor coil L. The pre-driver 210 generates a plurality of driving signals to control the switch circuit 200. The current limit circuit 230 receives the command signal Vc for generating the output signal Vo to the pulse width modulation control unit 240. The duty cycle control circuit 220 is configured to generate the first pulse width modulation signal Vp1 to the pulse width modulation control unit 240 based on the command signal Vc. The pulse width modulation control unit 240 is configured to generate the second pulse width modulation signal Vp2 to the pre-driver 210 based on the first pulse width modulation signal Vp1 and the output signal Vo. The duty cycle control circuit 220 may store the output duty cycle table or the output duty cycle graph. The current limit circuit 230 may store the current limit table or the current limit graph. The motor controller 20 may drive the motor according to the output duty cycle table and the current limit table. Also, the motor controller 20 may drive the motor according to the output duty cycle graph and the current limit graph. The motor controller 20 attains the function of maintaining the fixed output power by a plurality of current limit values, where each of the current limit values is less than or equal to the maximum rated current. The motor controller 20 is operated in a closed loop control mode based on the current limit values.

While the present invention has been described by the preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A motor controller configured to drive a motor, wherein the motor has a motor coil and a maximum rated current, and the motor controller comprises:
a switch circuit, configured to supply a motor current to the motor coil;
a pre-driver, configured to generate a plurality of driving signals to control the switch circuit, wherein the motor controller attains a function of maintaining a fixed output power by a plurality of current limit values, and the current limit values are predetermined values;
a current limit circuit, configured to store a current limit graph, wherein the current limit circuit receives a command signal for generating an output signal, the command signal has an input duty cycle, the command signal is used for adjusting a speed of the motor, and the current limit graph defines a relationship between a current limit of the motor current and the input duty cycle; and
a duty cycle control circuit, configured to store an output duty cycle graph.

2. The motor controller of claim 1, wherein the motor controller is operated in a closed loop control mode based on the current limit values.

3. The motor controller of claim 1, wherein each of the current limit values is less than or equal to the maximum rated current.

4. The motor controller of claim 1, wherein the motor controller is applied to a blower fan.

5. The motor controller of claim 1, wherein the duty cycle control circuit generates a first pulse width modulation signal bases on the command signal, and the first pulse width modulation signal has an output duty cycle.

6. The motor controller of claim 5, wherein the output duty cycle graph defines a relationship between the output duty cycle and the input duty cycle.

7. The motor controller of claim 5, wherein the motor controller further comprises a pulse width modulation control unit, the pulse width modulation control unit generates a second pulse width modulation based on the first pulse width modulation signal and the output signal, and the second pulse width modulation signal has a final duty cycle.

8. The motor controller of claim 7, wherein the pre-driver controls the switch circuit based on the final duty cycle.

9. The motor controller of claim 7, wherein the current limit circuit comprises a reference voltage generator, and the reference voltage generator generates a reference voltage based on the input duty cycle and the current limit graph.

10. The motor controller of claim 9, wherein the current limit circuit further comprises a comparator, and the comparator generates the output signal by the reference voltage.

11. A motor controller configured to drive a motor, wherein the motor has a motor coil, and the motor controller comprises:
a switch circuit, configured to supply a motor current to the motor coil;
a pre-driver, configured to generate a plurality of driving signals to control the switch circuit;
a current limit circuit, configured to store a current limit graph, wherein the current limit circuit receives a command signal for generating an output signal, the command signal is used for adjusting a speed of the motor, the current limit graph comprises at least a current limit value, and the current limit value is a predetermined value;
a duty cycle control circuit, configured to store an output duty cycle graph, wherein the duty cycle control circuit generates a first pulse width modulation signal based on the command signal.

12. The motor controller of claim 11, wherein the motor controller further comprises a pulse width modulation control unit, and the pulse width modulation control unit generates a second pulse width modulation signal to the pre-driver based on the first pulse width modulation signal and the output signal.

13. A motor controller configured to drive a motor, wherein the motor has a motor coil, and the motor controller comprises:
a switch circuit, configured to supply a motor current to the motor coil;

a pre-driver, configured to generate a plurality of driving signals to control the switch circuit;

a current limit circuit, configured to store a current limit table, wherein the current limit circuit receives a command signal for generating an output signal, the command signal is used for adjusting a speed of the motor, and the current limit table comprises at least a current limit value, and the current limit value is a predetermined value;

a duty cycle control circuit, configured to store an output duty cycle table, wherein the duty cycle control circuit generates a first pulse width modulation signal based on the command signal.

14. The motor controller of claim 13, wherein the motor controller further comprises a pulse width modulation control unit, and the pulse width modulation control unit generates a second pulse width modulation signal to the pre-driver based on the first pulse width modulation signal and the output signal.

* * * * *